US008622588B2

(12) United States Patent
Van Elmpt

(10) Patent No.: US 8,622,588 B2
(45) Date of Patent: Jan. 7, 2014

(54) LIGHT EMITTING MODULE, HEAT SINK AND ILLUMINATION SYSTEM

(75) Inventor: Rob Franciscus Maria Van Elmpt, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 386 days.

(21) Appl. No.: 12/989,445

(22) PCT Filed: Apr. 22, 2009

(86) PCT No.: PCT/IB2009/051648
§ 371 (c)(1),
(2), (4) Date: Oct. 25, 2010

(87) PCT Pub. No.: WO2009/133495
PCT Pub. Date: Nov. 5, 2009

(65) Prior Publication Data

US 2011/0037369 A1 Feb. 17, 2011

(30) Foreign Application Priority Data

Apr. 29, 2008 (EP) .................................... 08155319

(51) Int. Cl.
*F21V 29/00* (2006.01)
*F28D 15/00* (2006.01)
*H05K 7/20* (2006.01)

(52) U.S. Cl.
USPC ....................... 362/373; 165/104.33; 361/710

(58) Field of Classification Search
USPC ............ 362/294, 373; 165/67, 76, 80.1, 80.2, 165/80.3, 104.14, 104.33; 361/679.47, 361/679.54, 702, 709, 710
See application file for complete search history.

(56) References Cited

U.S. PATENT DOCUMENTS

| | | | | |
|---|---|---|---|---|
| 4,716,494 | A * | 12/1987 | Bright et al. | 361/704 |
| 5,331,510 | A * | 7/1994 | Ouchi et al. | 361/702 |
| 5,549,155 | A * | 8/1996 | Meyer et al. | 165/104.33 |
| 5,598,320 | A * | 1/1997 | Toedtman et al. | 361/679.47 |
| 5,826,645 | A * | 10/1998 | Meyer et al. | 165/104.33 |
| 5,983,995 | A * | 11/1999 | Shutou et al. | 165/104.33 |
| 6,052,285 | A * | 4/2000 | Hileman | 361/699 |
| 6,853,555 | B2 * | 2/2005 | Fichera et al. | 361/700 |
| 6,883,594 | B2 * | 4/2005 | Sarraf et al. | 165/104.33 |
| 7,267,167 | B2 * | 9/2007 | Lee | 165/182 |

(Continued)

FOREIGN PATENT DOCUMENTS

| | | | |
|---|---|---|---|
| JP | 2004273775 | A | 9/2004 |
| TW | 265773 | B | 11/2006 |
| WO | 2006031023 | A1 | 3/2006 |

*Primary Examiner* — Alan Cariaso
(74) *Attorney, Agent, or Firm* — Mark L. Beloborodov

(57) ABSTRACT

The invention relates to a light emitting module (10) comprising a light source (20) and a heat sink (30). The light source is thermally connected to the heat sink. The heat sink is configured to be detachably mounted on a cooling body (50), at least part of an outer wall (40) of the heat sink having a shape matching at least a part of an outer wall (56) of the cooling body to enable the transfer of heat generated by the light source to the cooling body. The effect of the measures according to the invention is that they enable the active cooling of the light emitting module to be separated from the light emitting module itself, thereby reducing the complexity of the light emitting module while still relatively easily enabling active cooling via the cooling body. The cooling body may, for example, be a cooling pipe through which a cooling fluid flows.

7 Claims, 4 Drawing Sheets

(56) References Cited

U.S. PATENT DOCUMENTS 7,300,187 B2 * 11/2007 Huang et al. .................. 362/373
7,461,952 B2 * 12/2008 Trenchardl et al. ........... 362/294
7,545,646 B2 * 6/2009 Holmberg et al. ............ 361/701
7,581,856 B2 * 9/2009 Kang et al. .................... 362/373
7,742,306 B2 * 6/2010 Shuai et al. .................. 361/710
2004/0026721 A1 2/2004 Dry
2005/0092469 A1 5/2005 Huang
2005/0158687 A1 7/2005 Dahm
2006/0092639 A1 5/2006 Livesay et al.
2007/0091562 A1 4/2007 Liao
2008/0049422 A1 2/2008 Trenchard et al.

* cited by examiner

LIGHT EMITTING MODULE, HEAT SINK AND ILLUMINATION SYSTEM

FIELD OF THE INVENTION

The invention relates to a light emitting module.

The invention also relates to a heat sink and to an illumination system comprising the light emitting module.

BACKGROUND OF THE INVENTION

Light emitting modules are known per se. They are used, inter alia, in general illumination systems, for example, for illuminating indoor and/or outdoor environments and, inter alia, in image projection systems such as beamers, projection televisions and liquid display devices. These light emitting modules are also emerging in headlight illumination systems, for example, for use in cars and motorcycles.

Currently a trend in light emitting modules is to reduce the size of the modules while increasing the light output of the light emitting modules. Generally this is possible by using high pressure discharge lamps, halogen lamps and/or light emitting diodes (hereinafter also referred to as LEDs) or laser diodes as a light source. These light sources have relatively small outer dimensions. A drawback of these light sources is that they generally require cooling. Especially when using light emitting diodes the light output which can be generated by the light emitting diode is directly related to the amount of cooling of the light emitting diode. For high power applications, cooling via a heat sink comprising cooling fins along which air flows for cooling the high power light emitting diodes is not sufficient and thus the high power light emitting modules are often cooled using a cooling pipe through which a cooling fluid is pumped. Using such an arrangement enables relatively small light emitting modules to produce a relatively high light output.

Cooling using cooling pipes requires extensive redesign of the light emitting module, meaning that, for example, the cooling pipes have to be integrated with the light emitting module to allow the cooling fluid to flow through the light emitting module for cooling. These integrated cooling pipes are subsequently connected to a cooling circuit to be able to cool the light emitting module. Such a light emitting module is, for example, known from TW265773B which discloses a water cooling-type LED heat dissipation device. This LED heat dissipation device is applicable in the light emitting module containing collectively disposed LEDs and further includes a heat dissipation sheet, at least a bent channel, at least a water inlet, and at least a water outlet. The bent channel is concavely installed in the heat dissipation sheet and comprises a heat conduction fluid flowing therein.

A disadvantage of the use of the known light emitting modules is that the construction is relatively complex.

SUMMARY OF THE INVENTION

It is an object of the invention to provide a light emitting module having reduced complexity.

According to a first aspect of the invention, the object is achieved with a light emitting module comprising a light source and a heat sink, the light source being thermally connected to the heat sink, the heat sink being configured for being detachably mounted on a cooling body, at least part of an outer wall of the heat sink having a shape matching at least a part of an outer wall of the cooling body for transferring heat generated by the light source to the cooling body.

"Detachably mounted" relates to a fixture or connection means which, in normal use of the light emitting module, enables the light emitting module to be attached to the cooling pipe via the heat sink and detached from the cooling pipe without damaging the cooling pipe or the heat sink. The heat sink may, for example, comprise fixture means such as screws or clamping means to mount the heat sink on to the cooling body. Other fixture means such as ribbons, Velcro (hook-and-loop fasteners) or glue which can be loosened, for example, with a flow of hot air, or other means by which the heat sink may be detachably mounted on the cooling body may be used without departing from the scope of the invention, as will be apparent to the person skilled in the art.

The effect of the light emitting module according to the invention is that the use of the light emitting module according to the invention enables separating the active cooling of the light emitting module from the light emitting module itself, which reduces the complexity of the light emitting module while still relatively easily enabling active cooling via the cooling body. The cooling body may, for example, be a cooling pipe through which a cooling fluid flows. The light emitting module according to the invention may be adapted, for example, to be mounted on relatively standard cooling pipes which may be applied at the location where the light emitting module must be installed. In the known light emitting module the active cooling fluid flows through the heat dissipation sheet, i.e. through channels in the heat dissipation sheet. These channels form part of the known light emitting module and must be fully leak-free to prevent the cooling fluid from damaging the light source in the known light emitting module either by the leaking cooling fluid or by a shortage of cooling fluid (which has leaked away), which may result in insufficient cooling of the light source and thus damage the light source. Especially when a number of the known light emitting modules are connected to the same cooling circuit, the chance of leakage of cooling fluid increases because each connection of the known light emitting module to the cooling circuit provides a potential leakage point. In the light emitting module according to the invention, the light emitting module only comprises a light source and a heat sink. The heat sink is configured such that it may be detachably mounted on a cooling body, for example, a cooling pipe. In this arrangement, the light emitting module is fully separated from the cooling circuit and may be connected to the cooling circuit by simply connecting part of the outer wall of the heat sink to the outer wall of the cooling pipe. The cooling circuit may be manufactured separately from the light emitting module and may be optimized to transport heat. When applying the light emitting modules to the cooling circuit, there need not be a change of the cooling circuit or interruption of the flow of cooling fluid inside the cooling circuit. The mounting of the light emitting module according to the invention merely requires the part of the outer wall of the heat sink to be in contact with the outer wall of a part of the cooling pipe of the cooling circuit to enable heat transfer from the heat sink to the cooling fluid. This simplifies the construction of the light emitting module significantly while allowing active cooling of the light source using cooling fluid.

A further benefit of the light emitting module according to the invention is that the flow of cooling fluid does not need to be interrupted for mounting the light emitting module according to the invention on to the cooling pipe. Because of this, the addition of an additional light emitting module, which requires active cooling via a cooling circuit, to a system which comprises the cooling circuit and several further light emitting modules may be done, while the further light emitting modules continue to operate and continue to be efficiently cooled via the cooling fluid.

An even further benefit of the light emitting module according to the invention is that the interface between the cooling fluid of the cooling pipes and the light source does not necessarily have to be waterproof. In the known light emitting module, the cooling pipes are an integral part of the heat sink. Due to this arrangement, the heat sink must be produced such that a leak-free connection can be made with the remainder of the cooling circuit. Therefore, when adding a light emitting module to the already installed light emitting modules, the cooling circuit must be shut down, and the existing cooling pipes must be cut such that the additionally installed light emitting module can be inserted into the cooling circuit. After extensive testing whether the newly attached light emitting module is leak-free, the cooling fluid may be transported again through the cooling circuit after which the light emitting modules may be used (again). Furthermore, the position where the known light emitting module is applied on the cooling pipes in the cooling circuit is fixed because the known light emitting module must be integrated into the cooling circuit by cutting the cooling circuit and inserting the known light emitting module. When applying the light emitting module according to the invention, the light emitting module may be mounted on the cooling pipe without the need to alter or interrupt the cooling circuit, which makes the addition of additional light emitting modules much easier. Furthermore, the location where the light emitting module is mounted on the cooling pipe is flexible and may be changed any time.

In an embodiment of the light emitting module, the light source is applied on the heat sink. This embodiment enables a relatively compact design of the light emitting module.

In an embodiment of the light emitting module, the outer wall of the heat sink is curved inward into the heat sink, the curved outer wall being defined by a radius substantially matching a radius of the cooling body. A benefit of this embodiment is that the curvature of the outer wall of the heat sink allows a relatively large contact area between the heat sink and the cooling body, which enables an efficient heat transfer between the heat sink and the cooling body. Furthermore, as the most commonly used cooling bodies are cooling pipes which have a substantially circular cross-section, the embodiment in which the radius of the curved wall substantially matches the radius of the cooling pipe enables the light emitting module to be applied on a cooling circuit comprising relatively common cooling pipes. This allows a very cost-efficient and very flexible lighting solution which may, for example, beneficially be used in, for example, greenhouses.

In an embodiment of the light emitting module, the outer wall of the heat sink comprises a first curved wall being defined by a first radius and a second curved wall being defined by a second radius being larger than the first radius.

In an embodiment of the light emitting module, the first curved wall is integrated within the second curved wall. A benefit of this embodiment is that the heat sink may be mounted either on a cooling pipe having a substantially circular cross-section defined by the first radius or on a cooling pipe having a substantially circular cross-section defined by the second radius. Thus, a single heat sink may be used as an interface to mount the light emitting module on different cooling pipes. Furthermore, the use of the first curved wall integrated within the second curved wall enables to use substantially the same mounting means for mounting the light emitting module on to any of the different cooling pipes.

In an embodiment of the light emitting module, the outer wall of the heat sink has a substantially cylindrical shape. A benefit of this embodiment is that most commonly used cooling bodies are cooling pipes which form a cooling circuit comprising, for example, a pump for circulating cooling fluid through the cooling pipes. When the outer wall of the heat sink is substantially cylindrical, the heat sink may relatively easily be detachably mounted on the cooling pipes of a common cooling circuit, which increases the usability of the light emitting module and reduces the cost of a system comprising both a plurality of light emitting modules and a cooling circuit.

In an embodiment of the light emitting module, the heat sink comprises an electrically conductive path between the cooling body and the light source. A benefit of this embodiment is that the use of this electrically conductive path enables to use the cooling body as an electrical connection and thus to provide the power to the light source via the cooling body, which is used both as part of a cooling circuit for transporting the cooling fluid and as part of an electrical circuit to provide power to the light source of the light emitting module. Especially in applications in which a plurality of light emitting modules are present which may be located relatively far apart, for example, in a greenhouse environment, the distance over which the power must be transported may be considerable. In view of the relatively large currents required by high power light emitting modules, the use of the cooling body as part of the electrical circuit is beneficial. Cooling bodies, and also cooling pipes, are typically made of materials which conduct heat relatively efficiently, such as copper. These materials are often also good conductors of electrical power, which makes the combination very easy and very beneficial. The use of the cooling pipes as electrical conductors typically increases the cross-section of the electrical conductors used to provide the power to the light emitting modules. Such an increase of the cross-section typically reduces the resistance of the electrical conductors, allowing the power to be provided to the light emitting modules in a more efficient manner. This, again, is especially beneficial in, for example, a greenhouse in which the distances over which the power must be transported to the light emitting modules may be considerable.

In an embodiment of the light emitting module, the light emitting module comprises mounting means for detachably mounting the heat sink on a cooling body. The mounting means may, for example, comprise screws or clamping means to mount the heat sink on to the cooling body. Other fixture means such as ribbons, Velcro or glue which may be loosened, for example, with a flow of hot air, or other means by which the heat sink may be detachably mounted on the cooling body may be used without departing from the scope of the invention.

In an embodiment of the light emitting module, the mounting means are configured to apply a force on the heat sink and the cooling body, thereby clamping the heat sink against the cooling body to allow heat transfer between the heat sink and the cooling body. Generally, a good connection between the heat sink and the cooling body is required to allow an efficient heat transfer. Therefore, the mounting means may be arranged such that the cooling body and the heat sink are clamped against each other so as to enable this efficient heat transfer.

BRIEF DESCRIPTION OF THE DRAWINGS

These and other aspects of the invention are apparent from and will be elucidated with reference to the embodiments described hereinafter.

In the drawings.

The Figures are purely diagrammatic and not drawn to scale. Particularly for clarity, some dimensions are exaggerated strongly. Similar components in the Figures are denoted by the same reference numerals as much as possible.

DETAILED DESCRIPTION OF EMBODIMENTS

Figure 1:
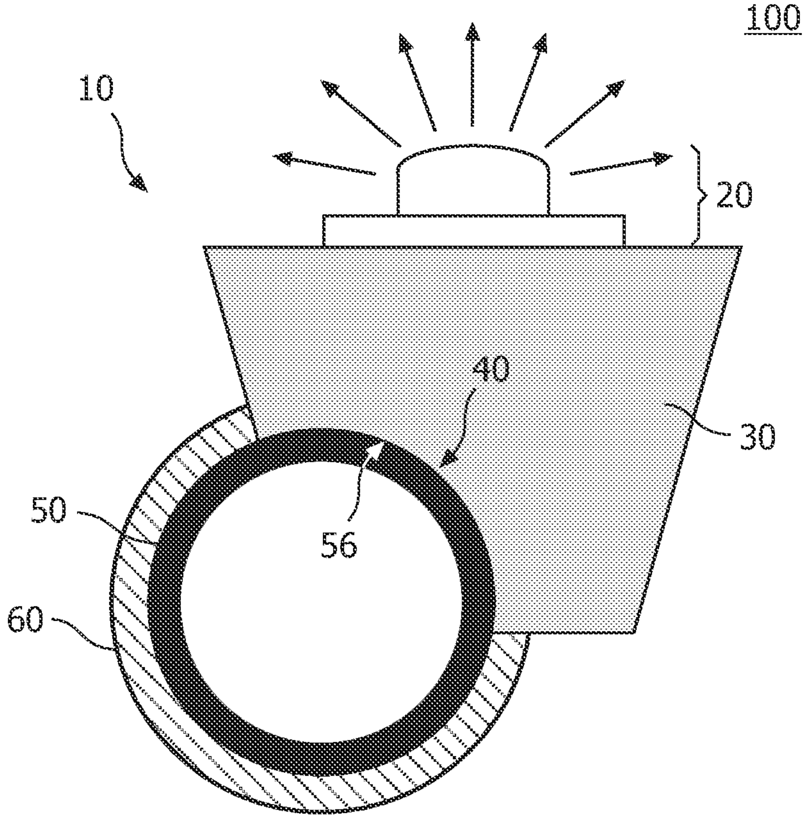
FIG. 1 shows a schematic cross-sectional view of an illumination system 100 comprising a light emitting module 10 according to the invention.

FIG. 1 shows a schematic cross-sectional view of an illumination system 100 comprising a light emitting module 10 according to the invention. The illumination system 100 comprises a cooling circuit (not shown) comprising a cooling body 50 being a cooling pipe 50. The illumination system 100 further comprises the light emitting module 10 according to the invention.

The light emitting module 10 comprises a light source 20 and a heat sink 30. The light source 20 is applied on the heat sink 30 and is thermally connected to the heat sink 30 to allow heat generated in the light source 20 to be transferred away from the light source 20. The light source 20 may, for example, be a light emitting diode 20, or a laser diode 20. The intensity of the light emitted by these light emitting diodes 20 or laser diodes 20 generally depends on the cooling of the light emitting diode 20 or the laser diode 20 and thus the cooling is essential for efficient usage of such a light source 20. Also other light sources 20, such as halogen lamps (not shown) or high pressure discharge lamps (not shown) or ultrahigh pressure discharge lamps (not shown) may require cooling for efficient usage of the light sources 20 and may be applied on the heat sink 30 and thermally connected to the heat sink 30 according to the invention.

The heat sink 30 is configured to be detachably mounted on a cooling body 50, which in the embodiment as shown in FIG. 1 is a cooling pipe 50. At least part of an outer wall 40 of the heat sink 30 has a shape which substantially matches at least a part of an outer wall 56 of the cooling pipe 50. Due to the matching shape of the outer wall 40 of the heat sink 30 and the outer wall 56 of the cooling pipe 50, the heat sink 30 may be connected to the cooling pipe 50 such that transfer of heat generated by the light source 20 to the cooling pipe 50 may occur relatively efficiently. In the embodiment shown in FIG. 1, part of the outer wall 40 of the heat sink 30 is curved inwards such that the curvature substantially matches the outer dimensions of the cooling pipe 50. In this manner, a substantial increase in the contact area between the heat sink 30 and the cooling pipe 50 is obtained which facilitates the transfer of heat from the light source 20 via the heat sink 30 to the cooling fluid in the cooling pipe 50. In a preferred embodiment of the heat sink 30, the outer wall 40 is cylindrically shaped to match the cylindrical shape of the cooling pipe 50.

The heat sink 30 is configured to be detachably mounted to the cooling body 50. "Detachably mounted" relates to a fixture or connection means 60 which in normal use of the light emitting module 10 enables the light emitting module 10 to be attached to the cooling body 50 via the heat sink 30 and detached from the cooling body 50 without damaging the cooling body 50 or the heat sink 30. The heat sink 30 may, for example, comprise fixture means 60 such as screws (not shown) or clamping means 62 (see FIG. 2A) to mount the heat sink 30 on to the cooling body 50. Other fixture means such as ribbons (not shown) or Velcro 60 as shown in FIG. 1 or other means by which the heat sink 30 may be detachably mounted on the cooling body 50 may be used without departing from the scope of the invention.

The light emitting module 10 according to the invention may be applied on a cooling circuit (not shown) comprising substantially standardized cooling pipes 50. The cooling circuit does not need to be interrupted when the light emitting module 10 according to the invention is being attached or added to the cooling circuit. This enables a relatively quick and easy replacement, addition or change in position of the light emitting module 10 according to the invention on a cooling circuit, thereby generating much flexibility and ease of use for a user of the light emitting modules 10.

Figure 2A:
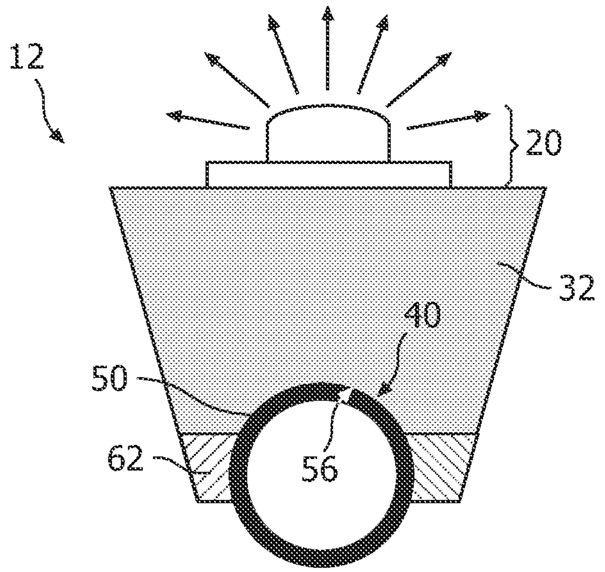
FIGS. 2A, 2B and 2C show a schematic cross-sectional view of further embodiments of the light emitting module according to the invention.
Figure 2B:
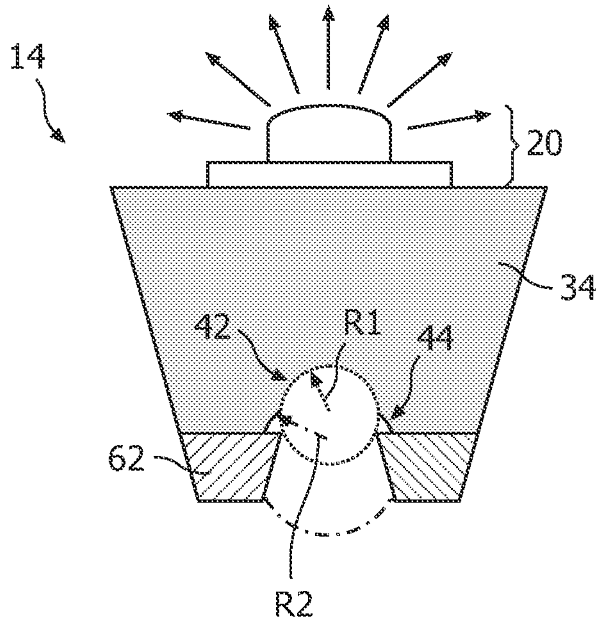
Figure 2C:
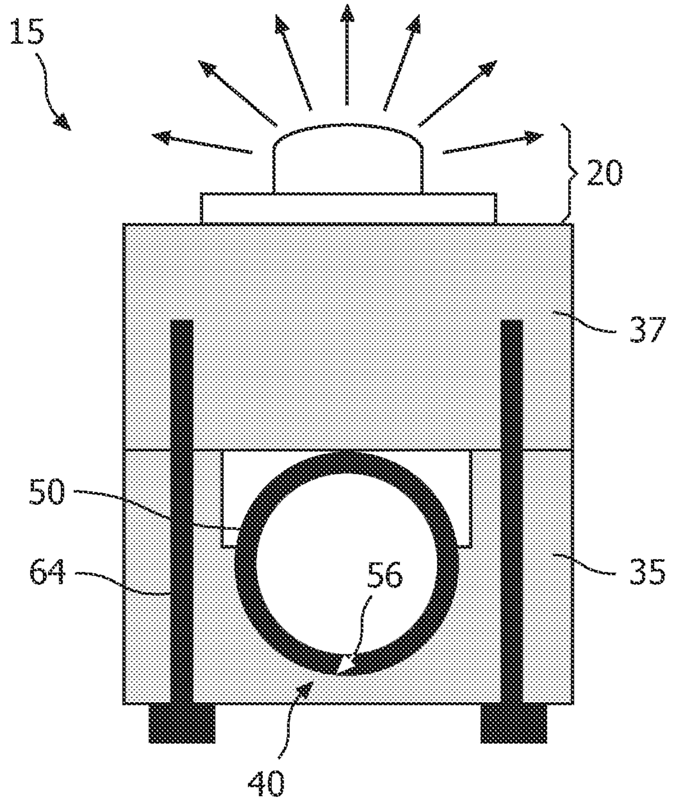

FIGS. 2A, 2B and 2C show schematic cross-sectional views of further embodiments of the light emitting module 12, 14, 15 according to the invention. The light emitting modules 12, 14 shown in FIGS. 2A and 2B again comprise the light source 20 applied on a heat sink 32, 34, respectively, and being thermally connected to the heat sink 32, 34. The light emitting module 15 shown in FIG. 2C comprises the light source 20 in thermal contact with the heat sink 35 which is applied on the opposite side of the cooling body 50, compared to the light source 20. In the light emitting module 12, 14, 15 shown in FIGS. 2A, 2B and 2C, the heat sink 32, 34, 35, respectively, is configured to be detachably mounted on the cooling pipe 50 via the cylindrically shaped outer wall 40, 42, 44. In the embodiment shown in FIGS. 2A and 2B, the heat sink 32, 34 is fixed to the cooling pipe 50, using elastic mounting means 62. By force-fitting the heat sink 32, 34 over the cooling pipe 50, the elastic mounting means 62 ensure that the heat sink 32, 34 is fixed to the cooling pipe 50 and is pressed against the cooling pipe 50 to allow efficient heat transfer between the heat sink 32, 34 and the cooling pipe 50. These elastic mounting means 62 allow relatively simple fitting of the light emitting module 12, 14 to the cooling pipe 50, and allow the light emitting modules 12, 14 to be moved relatively freely along the cooling pipe 50 to be positioned at any location along the cooling pipe 50. The elastic mounting means 62 may be constituted of rubber 62 or of elastic plastic material 62. Alternatively, the elastic mounting means may be constituted of metal and shaped to function as a spring. A benefit of this embodiment is that the use of metal typically increases the area along which the heat sink 32, 34 is in thermal contact with the cooling pipe 50, as metals typically are good heat conductors. Thus, more heat may be transferred via the heat sink 32, 34 to the cooling pipe 50, allowing improved cooling of the light source 20. In the embodiment shown in FIG. 2C, the heat sink 35 is fixed to the cooling pipe 50, using screws 64 which also enable to ensure that the heat sink 35 is pressed against the cooling pipe 50 to allow efficient heat transfer between the heat sink 35 and the cooling pipe 50.

In FIG. 2A the outer wall 40 of the heat sink 32 is curved inwards such that the curvature substantially matches the outer dimensions of the cooling pipe 50.

In FIG. 2B the outer wall of the heat sink 34 comprises a first curved wall portion 42 which is defined by a first radius R1, and comprises a second curved wall portion 44 which is defined by a second radius R2. In the embodiment of the light emitting module 14 as shown in FIG. 2B, the combination of the first curved wall portion 42 and the second curved wall portion 44 allows a single heat exchange interface of the heat sink 34, which may allow fitting the heat sink 34 to a plurality of different cooling bodies, for example, different cooling pipes 50. In the embodiment shown in FIG. 2B, the heat sink 34 may be mounted both on a cooling pipe 50 having an outer curved wall 56 being defined by the first radius R1 and on a cooling pipe 50 having an outer curved wall 56 being defined by the second radius R2. This further increases the ease of use and allows the heat sink 34 to be mounted on different cooling pipes 50. For example, the first radius R1 is approximately equal to 4 millimeter, and the second radius R2 is approximately equal to 9 millimeter.

In FIG. 2C the outer wall 40 of the heat sink 35 is curved inwards and the heat sink 35 is applied on an opposite side of the cooling pipe 50, compared to the light source 20. The light source 20 is applied on a further heat sink 37 and thus the light source 20 is in thermal contact with the heat sink 35 via the further heat sink 37. In this configuration the heat sink 35 and the further heat sink 37 substantially fully surround the cooling pipe 50, which enables a very efficient heat transition from the light source 20 to the cooling pipe 50, enabling effective cooling.

Figure 3A:
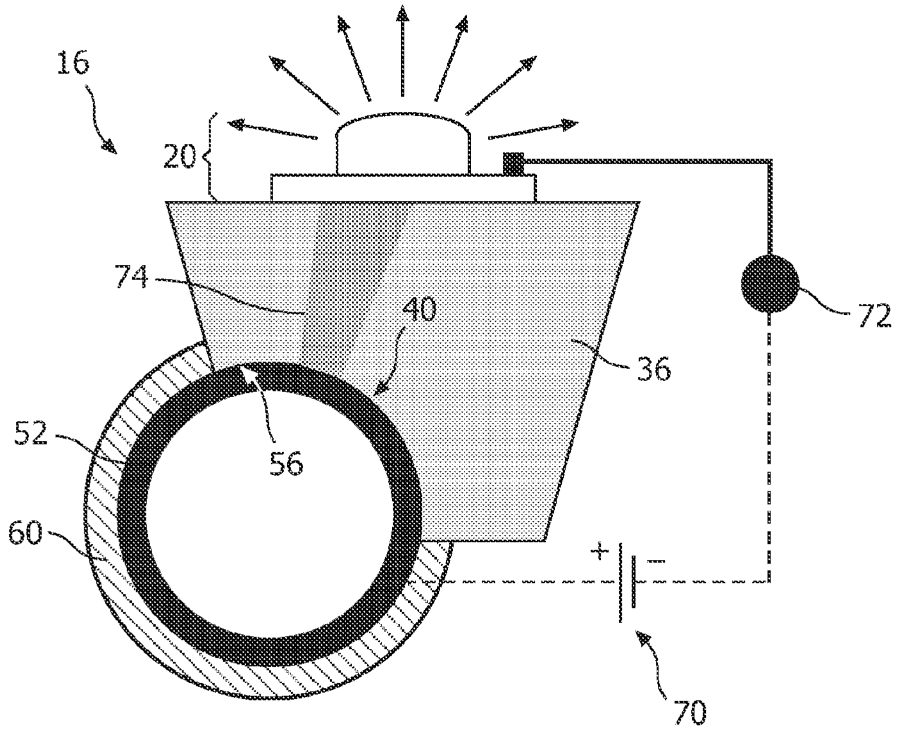
FIGS. 3A and 3B show a schematic cross-sectional view of the light emitting module according to the invention in which the cooling pipe is used as electrical connection for the electrical circuit providing power to the light emitting module.
Figure 3B:
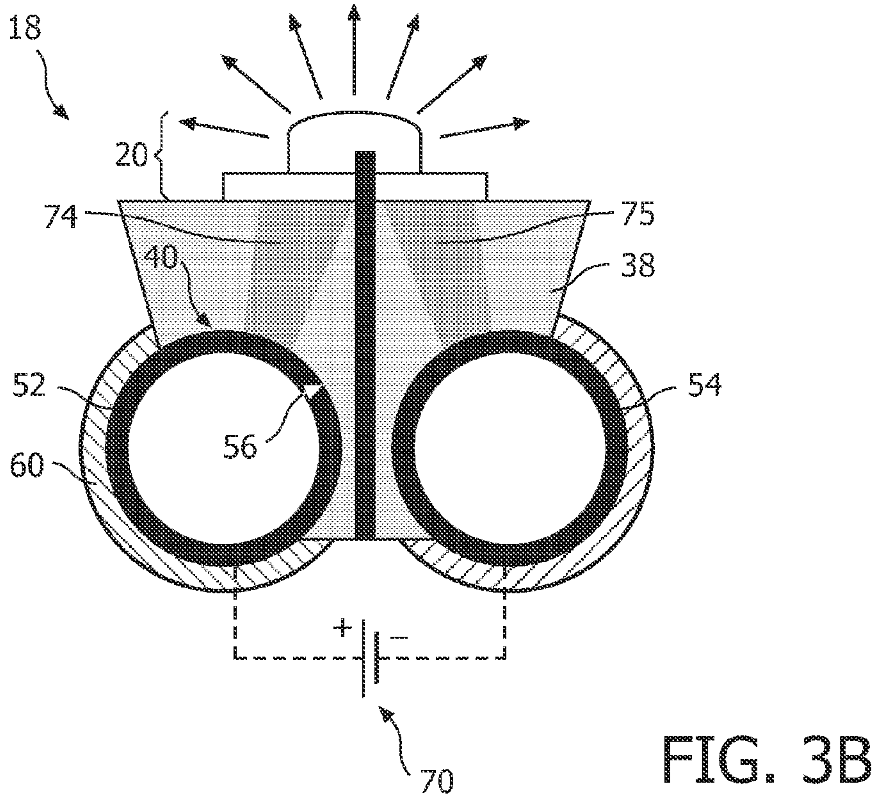

FIGS. 3A and 3B show a schematic cross-sectional view of the light emitting module 16, 18, respectively, according to the invention in which the cooling pipe 52, 54 is used as electrical connection for the electrical circuit providing power to the light emitting module 16, 18. The heat sink 36, 38 comprises an electrically conductive path 74, 75 for electrically connecting the light source 20 to the cooling pipes 52, 54 such that the power supplied via the cooling pipes 52, 54 may reach the light source 20. Such an electrical connection 74, 75 may be a metal rod 74, 75 cutting through the heat sink 36, 38. Alternatively the heat sink 36, 38 is constituted of a metal and thus the metal part of the heat sink 36, 38 is used both for conducting heat from the light source 20 to the heat sink 36, 38, and for conducting electricity from the cooling pipe 52, 54 to the light source 20.

In the embodiment of the light emitting module 16 as shown in FIG. 3A, the cooling pipe 52 is used as a single electrode 52 for providing power to the light source 20. The light source 20 is subsequently connected to a second electrode 72, and a power supply 70 is arranged between the cooling pipe 52 and the second electrode 72. This second electrode 72 may, for example, be an additional wire 72 arranged parallel to the cooling pipe 52, or, alternatively, the second electrode 72 may be ground, which may be a metal beam which may be part of the construction of a building, for example, the metal frame from which a greenhouse is constructed. In the embodiment of the light emitting module 16 as shown in FIG. 3A, the heat sink 36 comprises an electrically conductive path 74 between the cooling pipe 52 and the light source 20. Alternatively, as indicated before, the heat sink 36 may be constituted of a metal which may function both as a thermal conductor to conduct heat generated by the light source 20 to the cooling pipe 52 and as an electrical conductor to conduct electrical energy from the cooling pipe 52 to the light source 20. The heat sink 36 is mounted on the cooling pipe 52 using Velcro. Of course other means of detachably mounting the heat sink 36 to the cooling pipe 52 may be used without departing from the scope of the invention.

In the embodiment of the light emitting module 18 as shown in FIG. 3B, two cooling pipes 52, 54 are arranged parallel to each other and the light emitting module 38 is arranged between the two cooling pipes 52, 54. Using two parallel cooling pipes 52, 54 allows an increased cooling capability and allows to use both cooling pipes 52, 54 as electrodes for providing power to the light source 20. One of the cooling pipes, i.e. cooling pipe 52, is connected to the anode of the power supply 70 and the other cooling pipe 54 is connected to the cathode of the power supply 70. Both cooling pipes 52, 54 may be conduits for cooling fluid, allowing active cooling of the light emitting module 18. Furthermore, the heat sink 38 may comprise two conductive paths 74, 75 for electrically connecting the cooling pipes 52, 54 to the light source 20. Alternatively, the heat sink 38 may be constituted of two metal parts being separated by an insulator. The two metal parts are each connected to one of the cooling pipes 52, 54 and the insulating separation prevents electrical short-circuits between the two cooling pipes 52, 54.

The cooling pipes 52, 54 may comprise an insulating cover (not shown) to prevent a user from touching the cooling pipes 52, 54. Such an insulating cover may be made of, for example, foam, rubber, plastic or some other insulating material. At the location where the light emitting module 16, 18 is applied to the cooling pipes 52, 54, the insulating cover is removed to allow a thermal connection between the cooling pipes 52, 54 and the heat sink 36, 38. Furthermore, such a local removal of the insulating cover also allows electrical contact between the electrical conductive path 74, 75 and the cooling pipe 52, 54 such that the light emitting module 16, 18 is in electrical contact with the cooling pipe 52, 54. Alternatively, the heat sink 36, 38 comprises a pin (not shown) or a plurality of pins (not shown) which penetrate the insulating cover to generate the thermal and/or electrical connection between the heat sink 36, 38 and the cooling pipe 52, 54. In such an embodiment, the pins, for example, make very small holes in the insulating material, such that after removal or displacement of the light emitting module 16, 18 the insulating layer, although punctured by the pins, still functions partially as an insulating material preventing that a user can touch the cooling pipes 52, 54.

The light emitting modules 16, 18 according to the invention may, for example, beneficially be used in a greenhouse environment (not shown). Currently, the illumination of plants in a greenhouse is mainly done using high pressure discharge lamps arranged in special reflectors to allow a uniform distribution of light over a relatively large area. Such a high pressure discharge lamp requires much space and requires a special power supply which should be placed in the vicinity of the high pressure discharge lamp. Such a high pressure discharge lamp cannot easily be moved from one place to another and cannot easily be added to the system, as it typically requires an additional power supply to be installed in the greenhouse. When applying the light emitting module 16, 18 according to the invention, the light emitting module 16, 18 may be mounted at substantially any position along the cooling pipes 52, 54 which may be distributed throughout the greenhouse. This mounting on the cooling pipes 52, 54 does not require the cooling circuit to be shut down or interrupted. Furthermore, the exact position of the light emitting module on the cooling pipes 52, 54 may substantially be chosen randomly, which increases the flexibility for a user substantially. Especially when the cooling pipes 52, 54 are also used as electrodes for providing power to the light emitting modules 10 as is shown in FIGS. 3A and 3B, the light emitting module 16, 18 may be placed substantially everywhere on the cooling pipe 52, 54.

Furthermore, the light intensity in a greenhouse may be relatively high, for example, on a cloudy day. To produce high intensity light from light emitting modules, the light emitting modules 16, 18 consume much power which must be supplied to the light source 20. Generally, the currents provided to the light sources 20 are relatively large to enable the light sources 20 to emit the high intensity light. Substantially standard cables for providing these high currents have a relatively low efficiency as the resistance of relatively standard cables is too large—causing a reduction of the efficiency. High power electric cables are relatively expensive, especially when they are used to cover the large distances which are typically required in greenhouses. By using the cooling pipes 52, 54 for providing electrical power to the light source 20, the efficiency of the power circuit is improved while the use of high power electric cables is omitted.

Thus, the cooling pipes allow for active cooling of the light source 20 in the light emitting module 16, 18 and provide power to the light source 20.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. Light emitting module comprising:

a light source;

a heat sink, the light source being applied on the heat sink and being thermally connected to the heat sink, the heat sink being configured for being detachably mounted on a cooling body, wherein at least part of an outer wall of the heat sink comprises a shape matching at least a part of an outer wall of the cooling body for transferring heat generated by the light source to the cooling body, and wherein said outer wall of the heat sink is configured to partially envelop the outer wall of the cooling body; and mounting means for detachably mounting the heat sink on the cooling body, wherein said mounting means is an elastic mounting means that is composed of a material that is different from a material composing the at least a part of the outer wall of the heat sink and wherein said mounting means and said heat sink are configured such that said mounting means remains attached to said heat sink when said heat sink is detached from said cooling body.

2. Light emitting module as claimed in claim 1, wherein the outer wall of the heat sink is curved inward into the heat sink, the curved outer wall being defined by a radius substantially matching a radius of the cooling body.

3. Light emitting module as claimed in claim 2, wherein the outer wall of the heat sink has as substantially cylindrical shape.

4. Light emitting module as claimed in claim 1, wherein the outer wall of the heat sink comprises a first curved wall portion being defined by a first radius (R1) and a second curved wall portion being defined by a second radius (R2) being larger than the first radius (R1).

5. Light emitting module as claimed in claim 4, wherein the first curved wall portion is integrated within the second curved wall portion.

6. Light emitting module as claimed in claim 1, wherein the heat sink comprises an electrically conductive path between the cooling body and the light source.

7. Light emitting module as claimed in claim 1, wherein the mounting means are configured to apply a force on the heat sink and the cooling body, thereby clamping the heat sink against the cooling body for allowing heat transfer between the heat sink and the cooling body.

* * * * *